United States Patent [19]

Masuda et al.

[11] Patent Number: 5,416,809
[45] Date of Patent: May 16, 1995

[54] DIGITAL PHASE LOCKED LOOP APPARATUS

[75] Inventors: Shozo Masuda; Kazutoshi Shimizume, both of Kanagawa, Japan

[73] Assignee: Sony Corporation, Tokyo, Japan

[21] Appl. No.: 52,822

[22] Filed: Apr. 26, 1993

Related U.S. Application Data

[63] Continuation-in-part of Ser. No. 849,871, Mar. 12, 1992, abandoned.

[30] Foreign Application Priority Data

Mar. 13, 1991 [JP] Japan .................. 3-074111

[51] Int. Cl.⁶ .............................. H03L 7/20
[52] U.S. Cl. ........................ 375/376; 331/11; 360/26; 369/109
[58] Field of Search ............... 375/120; 331/11, 25, 331/34, 42; 342/195; 360/26, 29; 369/44.25, 44.26, 48, 54, 59, 109, 111, 124

[56] References Cited

U.S. PATENT DOCUMENTS

| | | | |
|---|---|---|---|
| 4,308,505 | 12/1981 | Messerschmitt | 331/25 |
| 4,763,342 | 8/1988 | Ambrosio et al. | 377/43 |
| 4,845,685 | 7/1989 | Wechsler et al. | 342/195 |
| 4,901,300 | 2/1990 | Van Der Zande et al. | 369/59 |
| 4,972,398 | 11/1990 | Wachi | 369/44.25 |
| 5,012,204 | 4/1991 | Storz et al. | 331/25 |
| 5,172,357 | 12/1992 | Taguchi | 331/25 |

Primary Examiner—Stephen Chin
Assistant Examiner—Don N. Vo
Attorney, Agent, or Firm—Hill, Steadman & Simpson

[57] ABSTRACT

A digital phase-locked loop circuit for compact discs is provided. Averaging circuits are used to determine the wavelength of each pattern in an eight-to-fourteen modulation signal reproduced from a given compact disc by computing an average value of the lengths of the patterns.

1 Claim, 5 Drawing Sheets $IT = \dfrac{C_o}{n} = \dfrac{1}{nf_0}$

ROM Table

| N \ ΔT | -3 | -2 | -1 | 0 | 1 | 2 | 3 |
|---|---|---|---|---|---|---|---|
| 3 | -12 | -8 | -4 | 0 | 4 | 8 | 12 |
| 4 | -9 | -6 | -3 | 0 | 3 | 6 | 9 |
| 5 | -7.2 | -4.8 | -2.4 | 0 | 2.4 | 4.8 | 7.2 |
| 6 | -6 | -4 | -2 | 0 | 2 | 4 | 6 |
| 7 | -5.1 | -3.4 | -1.7 | 0 | 1.7 | 3.4 | 5.1 |
| 8 | -4.5 | -3 | -1.5 | 0 | 1.5 | 3 | 4.5 |
| 9 | -4 | -2.7 | -1.3 | 0 | 1.3 | 2.7 | 4 |
| 10 | -3.6 | -2.4 | -1.2 | 0 | 1.2 | 2.4 | 3.6 |
| 11 | -3.3 | -2.2 | -1.1 | 0 | 1.1 | 2.2 | 3.3 |

Output Data

DIGITAL PHASE LOCKED LOOP APPARATUS

This is a continuation-in-part of application Ser. No. 07/849,871, filed 12 Mar. 1992

BACKGROUND OF THE INVENTION

1. Field of the Invention

The present invention relates to a digital phase locked loop circuit for compact-disc players and, in particular, is well applicable to prevention of a malfunction generated by wave distortion which is, in turn, caused by asymmetry.

2. Description of the Prior Art

As is commonly known, a signal read from a compact disc may contain asymmetry Such asymmetry is caused typically by the fact that the sizes and shapes of the pits engraved on the compact disc vary depending upon a variety of conditions such as the power of the light used for mastering and the phenomenon time.

Let certain part of a signal read from a compact disc comprise a component generated by a disc portion with a pit length of, for example, 3T and a non-pit area also with an equal length of 3T, and another component coming from another disc portion with a pit length of 4T and a non-pit area also with an equal length of 4T, where T is a channel-clock period. Note that there are nine different pit lengths. This means the such pit-length components of the signal each have a duty cycle of 50%.

If all parameters are perfectly controlled, a pit with a duty cycle of 50% can be accurately engraved on tracks of the compact disc. If the parameters are shifted out off the perfectly controlled states even slightly, however, a deviation is resulted in so as to gradually lenghten or shorten the pit by an equal amount in the longitudinal direction of the pit, giving rise to inconvenience.

The phenomenon described above is called asymmetry. At the present stage of technology, the asymmetry phenomenon cannot be eliminated completely during the manufacturing of the compact disc. In addition, asymmetry of the signal itself which is read by the pickup varies with the wavelength of the laser being used.

The asymmetries generated as described above give rise to discrepancies which appear as phase and frequency jitters in the phase locked loop circuit. As a result, a worsened error rate may be brought about. In particular, in a locked state of the phase locked loop circuit with a frequency deviation remaining in the EFM (Eight-to-Fourteen Modulation) signal, the effect of the asymmetries is very great, causing inconvenience.

In the case of a compact-disc system, by the way, the length of the smallest pit is of the order of 0.86μm. Such a length is sufficiently big in comparison to the width which is only 0.5μm. There is almost no case in which a short pit has a narrowed width in comparison to a long pit due to the effect of the asymmetry in the transversal direction. That is to say, the asymmetry has a uniform effect in the transversal direction on all pits regardless of their lengths. As for the effect in the longitudinal direction, the asymmetry lengthens or shortens the pits of all lengths by an equal amount as is described previously. In the case of a disc adopting the CD technique, the effect of the asymmetry is made fall within a certain range. In addition, a compact-disc player incorporates a circuit for automatically compensating for the effect of the asymmetry. In this way, the inconvenience caused by the asymmetry is avoided.

That is to say, the digital phase locked loop circuit incorporated in a compact-disc player carries out phase control and frequency control independently of each other. The frequency control measures the length of each pattern of the EFM signal, outputting a frequency deviation $\Delta f$. The frequency deviation is then added to the playback-clock as an offset.

On the other hand, the phase control simply detects the difference in phase between the EFM signal and the playback clock, feeding back the difference to the playback clock as a correction quantity thereof.

The frequency is computed by measuring the wavelength of each pattern and applying a predetermined weight to the difference between the measured value and a standard length. Note that the predetermined weight is applied because even for the same measurement value, the frequency differs from pattern to pattern. The weighted differences are then integrated to give a frequency deviation. It is obvious that frequency variations of even small patterns such as the 3T and 4T components are recognized as a large frequency deviation. As a result, the effect of wave distortion due to the asymmetry is great, giving rise to, among other things, an uncontrolled state out off the phase locked loop.

OBJECT AND SUMMARY OF THE INVENTION

It is an object of the present invention to provide a digital phase locked loop apparatus which allows wavelengths to be measured accurately, avoiding an unlocked state out off the control of the phase locked loop caused by the effect of asymmetry.

The present invention provides a digital phase locked loop circuit for compact discs characterized by including averaging circuits for computing the mean value of the lengths of an EFM signal's patterns reproduced from a given compact disc and finding the wavelengths of the patterns.

As such, the wavelengths of the patterns are found by calculating the average value of the patterns lengths. By doing so, the wavelengths of an EFM signal's patterns can be measured accurately even if the wavelengths of the patterns vary depending upon polarities because of asymmetry. As a result, the digital phase locked loop circuit provided by the present invention prevents a malfunction from occurring due to wave distortion which is, in turn, caused by the asymmetry inherent in a compact disc.

DESCRIPTION OF THE PREFERRED EMBODIMENTS

Figure 1:
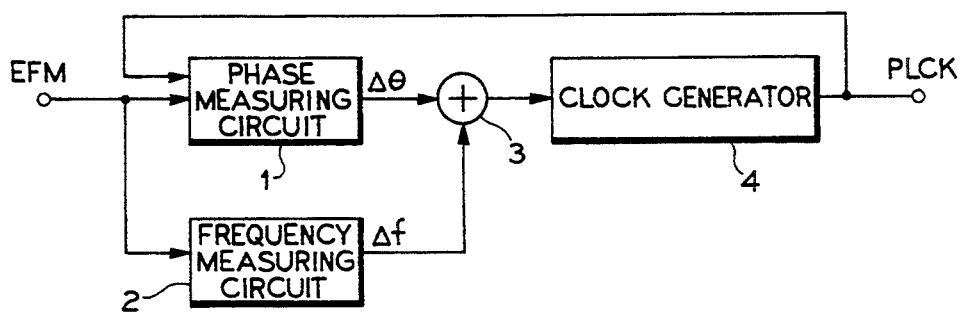
FIG. 1 is a diagram showing a configuration of an embodiment implementing a digital phase locked loop circuit for compact discs in accordance with the present invention.

FIG. 1 is a diagram showing a configuration of an embodiment implementing a digital phase locked loop circuit for compact discs in accordance with the present invention. As shown in the figure, the digital phase locked loop circuit implemented by the embodiment comprises, among other components, a phase measuring circuit 1, a frequency measuring circuit 2, an adder 3 and a clock generator 4.

Figure 2:
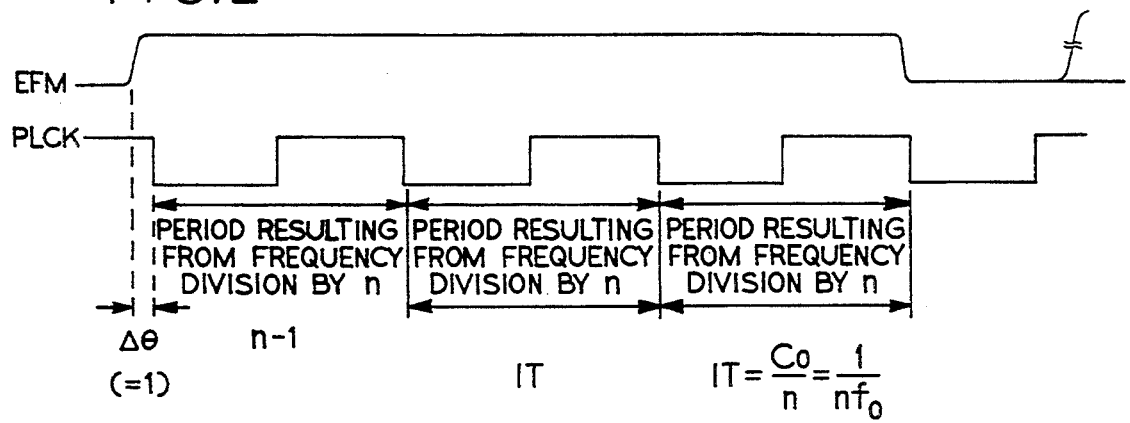
FIG. 2 is a diagram showing waveforms used for explaining the principle of operation of the digital phase locked loop circuit provided by the present invention the configuration of which is shown in FIG. 1.

As described above, FIG. 1 is a diagram showing a configuration of an embodiment implementing a digital phase locked loop circuit for compact discs in accordance with the present invention. Referring also to FIG. 2, the digital phase locked loop circuit is explained. The frequency $f_0$ of the operation clock $C_0$ is a multiple of the channel-clock frequency $T^{-1}$ which is 4.3218 MHz.

$$f = R \cdot 1/T \text{ (R: integer number)}$$

where R is an integer multiple. In other words, dividing the operation clock $C_O$ by an integer R gives 1T which is exactly equal to the period of PLCK, a signal generated by the clock generator 4 as shown in FIG. 1.

The phase measuring circuit 1 measures the phases of the PLCK and EFM signals. To put it in actual terms, the distance from a changing edge of the EFM signal to the trailing edge of the PLCK signal is measured using a counter zero contents of the counter indicate that the phases match each other.

For example, let the contents of the counter be Δθ. In this case, in order to make both the phases match each other, it is necessary to reduce any one period of the PLCK signal by Δθ before the next changing edge of the EFM signal.

The frequency measuring circuit 2 is used for measuring the frequency of the EFM signal. The period of the normal EFM signal is a multiple of T, the period of the channel clock. In actuality, the frequency varies due to variations in disc rotation, resulting in a change in T. Let ΔT be the change in T. The modified period Tm is then given as follows:

$$Tm = T + \Delta T$$

As described above, the frequency measuring circuit 2 is used for measuring the frequency of the EFM signal. Under a normal condition, the frequency of the EFM signal is a multiple of the channel-clock frequency f ($T^{-1}$=4.3218 MHz) which is 4.3218 MHz. The frequency f may fluctuate due to variations in disc rotation caused by external disturbances. Let f' be the fluctuating frequency which is given by the following equation:

$$f' = f + \Delta f$$

The above equation can also be expressed in terms of periods as follows:

$$T' = T + \Delta T$$

The change in period expressed by the above equation gives rise to a steady phase shift which is beyond the capability of the phase control and, thus, cannot be eliminated by using the phase control only.

This frequency measuring circuit 2 measures the change in frequency (Δf) which is then used for correcting the PLCK signal. The measurement is carried out in the same way as the phase measuring circuit 1. To be more specific, the wavelength of the EFM signal is measured by means of a counter for counting the number of operation-clock pulses $C_o$. For the waveforms of the nT patterns, where n is an integer in the range 3 to 11, the following equation holds true.

$$\begin{aligned} nT' &= n(T + \Delta T) \\ &= nT + n \cdot \Delta T \end{aligned}$$

For values of ΔT in a certain range, the value of n can be estimated from the contents of the counter. Since the contents of the counter are read when the period T reaches the integer k, the integer k can be substituted for T in the above equation to give the following $$n \cdot \Delta T = \text{Measured Counter Value} - n \cdot k$$
$$\Delta T = (\text{Measured Counter Value} - n \cdot k)/n$$

In actual terms, the value of k is 8 and for n =3, a measured count value of 25 gives the following change in period:

$$\Delta T = \tfrac{1}{3}$$

This means that for a period length of 1T, a frequency shift of ⅓ of the frequency of the operation clock $C_o$ results. For n=9, the measured count value is 75.

Based on the value of ΔT, modulation is applied to the clock generator 4 at correct timing. In this way, the generation of the PLCK signal can be compensated for such frequency shifts.

As such, a weight is attached to the measured value by estimating the value of n in the frequency measurement. In this way, the present invention allows measurement errors to be considerably reduced.

Figure 4:
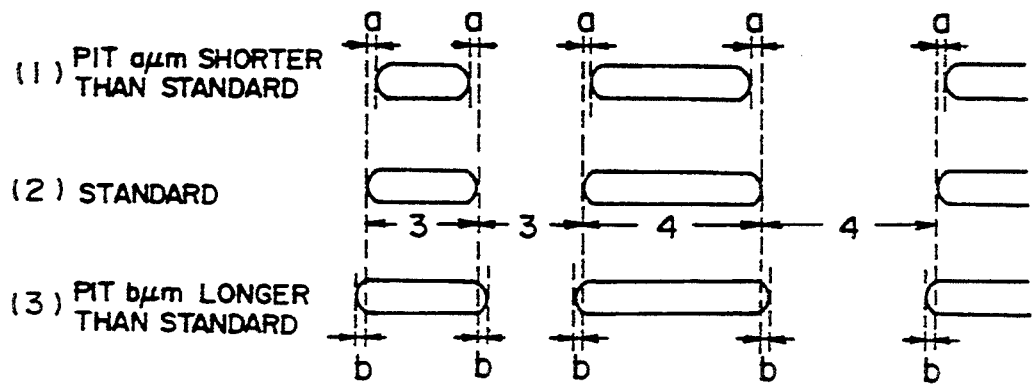
FIG. 4 is a diagram showing pit patterns on a compact disc used for explaining asymmetry.

As described above, the digital phase locked loop circuit for compact discs implemented by the embodiment is used for preventing the wavelengths of the patterns from fluctuating depending on polarities due to asymmetries shown by an explanatory diagram of FIG. 4. Note that FIG. 4 shows a portion comprising a pit with a length of 3T and a non-pit area having the same length as the pit. Also shown in FIG. 4 is a portion comprising a pit with a length of 4T and a non-pit area having the same length as the pit.

Figure 5:
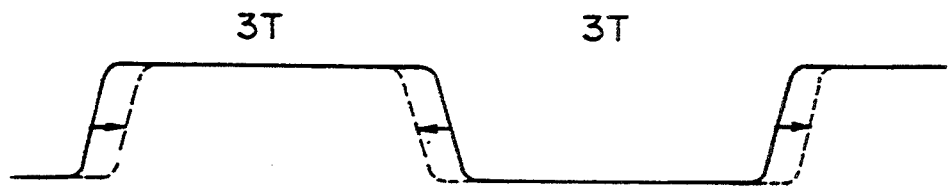
FIG. 5 is a diagram showing waveforms for explaining variations in wavelength due to the symmetry shown in FIG. 4.

FIG. 4 (2) shows a case in which the pits each have a standard length. On the other hand, FIG. 4 (1) shows a case in which the pits or the positive halves each have a length which is aμm shorter than the standard size while FIG. 4 (3) shows a case in which the pits or the positive halves each have a length which is bμm longer than the standard size. Accordingly, when a track having portions shown in FIG. 4 (1) is traced, the "H"-level part of the generated pulse signal is shorter than the correct pulse width which is drawn using a solid line as shown in a waveform of FIG. 5, giving rise to a problem. In the worst case, the generation of such a phenomenon can result in a problem caused by an unlocked state of the phase locked loop.

The embodiment for implementing a digital phase locked loop circuit for compact discs in accordance with the present invention solves the above problems as follows.

As shown in FIG. 1, a reproduction signal EFM read from a compact disc not shown in the figure, is supplied to the phase measuring circuit 1 and the frequency measuring circuit 2 as well. The phase measuring circuit 1 measures a difference in phase $\Delta\theta$ between the EFM reproduction signal and PLCK, a reproduction clock. The difference in phase ($\Delta\theta$) is fed back to the clock generator 4 as a quantity of correction. As such, the digital phase locked loop provided by the present invention adopts the same strategy as the conventional phase locked loop circuit for compact discs as far as the phase measurement is concerned.

Figure 3:
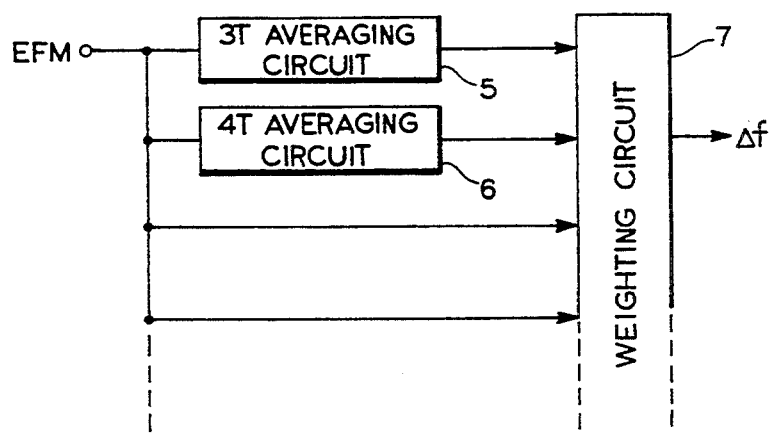
FIG. 3 shows a configuration of a frequency measuring circuit incorporated in the digital phase locked loop circuit provided by the present invention the configuration of which is shown in FIG. 1.

In addition to the phase measuring circuit 1, however, the embodiment incorporates the frequency measuring circuit 2 having a configuration shown in FIG. 3. For high frequencies, changes in wavelength by polarity are recognized as large frequency deviations. For small patterns such the 3T and the 4T, therefore, averaging circuits 5 and 6 are provided respectively for computing the average values for the patterns and, thus, determining their wavelengths. The outputs of the averaging circuits 5 and 6 are supplied to a weighting circuit 7 which attaches predetermined weights thereto in order to compute a frequency deviation $\Delta f$.

There are a variety of means that can be used for implementing the averaging circuit 5 for the 3T pattern and the averaging circuit 6 for the 4T pattern. The following are just typical ones.

Figure 6:
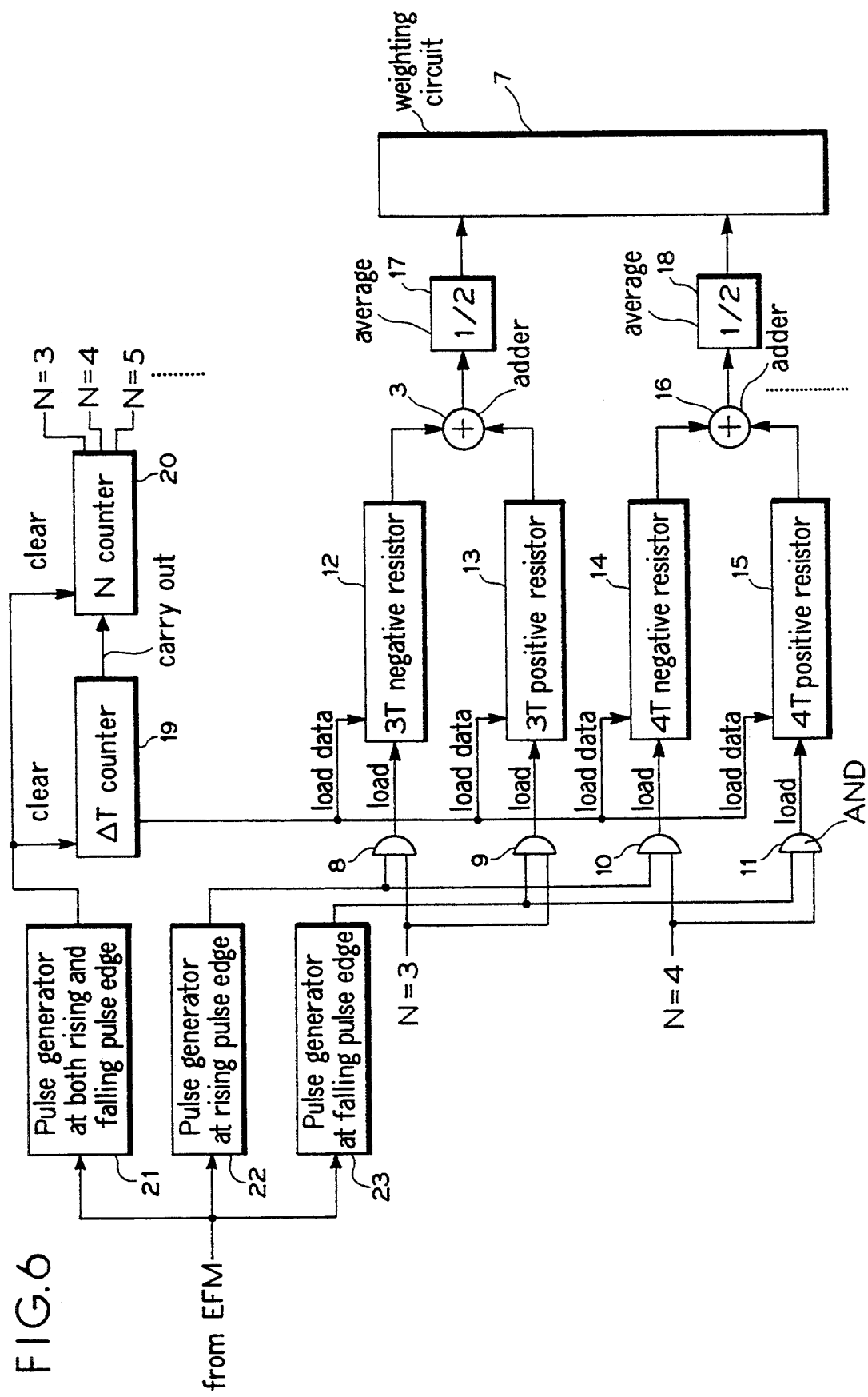
FIG. 6 is a diagram illustrating a first exemplary embodiment of an averaging circuit.

As illustrated in FIG. 6, a first means finds the wavelength of a pattern by taking the average of the widths of the positive and negative pulses. As has been explained by referring to FIG. 4 and 5, the positive portion of the pulse signal is lenghtened or shortened due to asymmetry. By taking the average value of the widths of the positive and negative pulses for a reproduction signal, therefore, wave distortion caused by the asymmetry can be corrected, allowing the wavelength to be measured correctly.

In the first exemplary embodiment of FIG. 6, the adders 3, 16, etc., add the digital data output from resistors 12, 13 and 14, 15, etc., respectively. An output from each of adders 3, 16, etc., is then averaged at 17, 18, etc., and fed to the weighting circuit 7. The negative and positive resistors 12, 13, 14, 15, etc., store the 2's complementary digital data.

As a second means, a filter is used for taking an average value and, thus, allowing the wavelength to be computed accurately by ignoring the polarities of both the positive and negative pulses. This concept is based on the fact that in the course of measuring an average, the positive and negative pulses each have a probability to appear of 50% anyway. By processing the pulse signal in this way, the wavelength can be measured without any problems.

Figure 7:
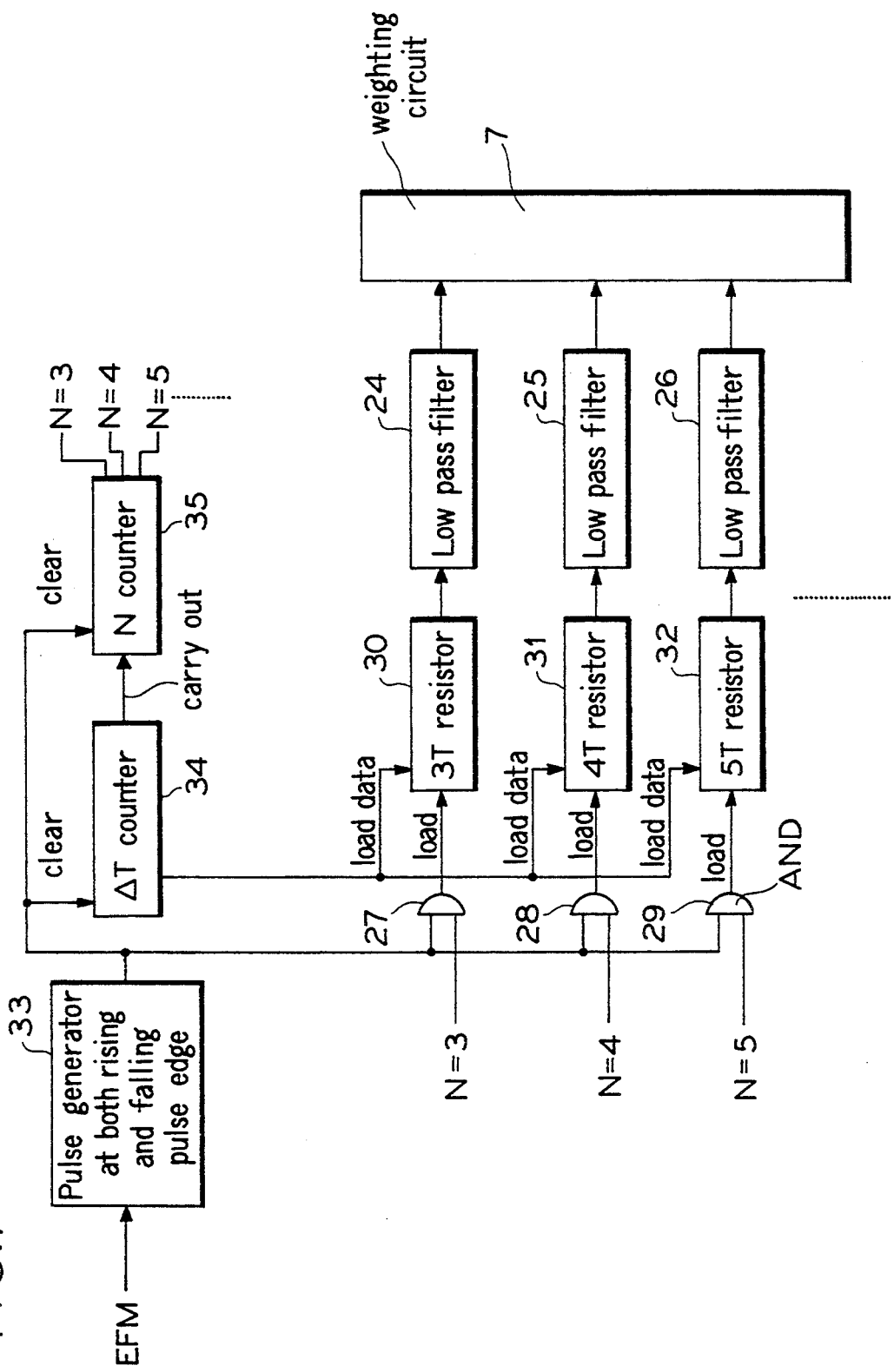
FIG. 7 is a diagram illustrating a second exemplary embodiment of an averaging circuit.

FIG. 7 illustrates a second exemplary embodiment of the averaging circuit, or the second means. Low pass filters 24, 25, 26, etc., formed by second order IIR digital filters, are provided for taking an average value of the wavelength of a pattern. In this embodiment, a load signal from AND gates 27, 28, and 29, etc., is infed to resistors 30, 31, 32, etc., respectively. A pulse generator 33 is also provided. An output signal from the pulse generator 33 is connected to counters 34, 35 and to a first input of AND gates 27, 28, and 29, etc. A second input for AND gates 27, 28, 29, etc., is connected to an input from N=3, N=4, N=5, N=5+1, etc., from the N counter, respectively. Load data is provided by counter 34 to resistors 30, 31, 32, etc. A carry out from counter 34 is connected to N counter 35. Digital data from resistors 30, 31, 32, etc., is infed to low pass filters 24, 25, 26, etc., respectively. Outputs from filters 24, 25, 26, etc., are then fed to weighting circuit 7.

Figures 8, 9:
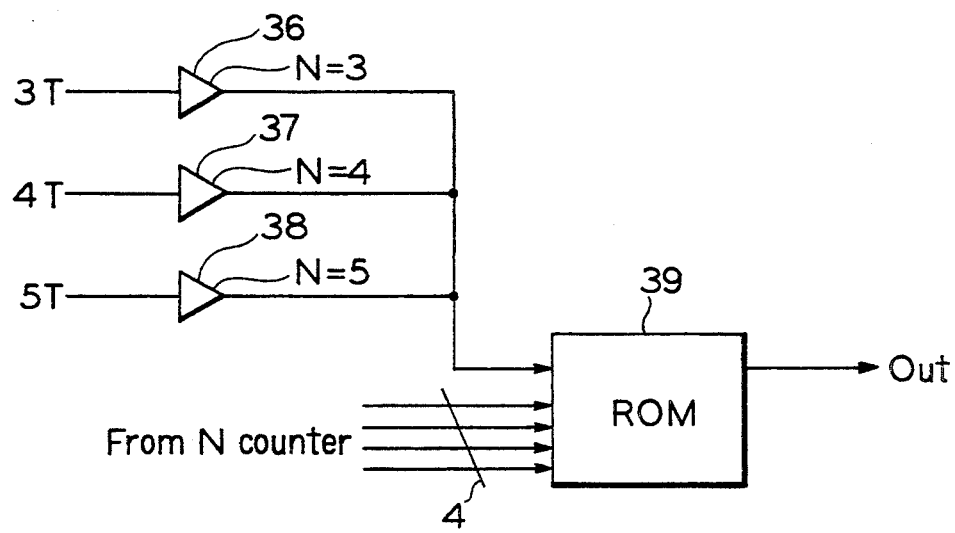
FIG. 8 illustrates a circuit diagram for a weighting circuit constructed in accordance with the principles of the present invention.
FIG. 9 is a ROM table illustrating the output data for ΔT and N.

A circuit diagram for weighting circuit 7 is illustrated in FIG. 8. The weighting circuit includes comparators 36, 37, 38, etc., which compare the 3T and N=3, 4T and N=4, and 5T and N=5, etc. signals, respectively. Outputs from comparators 36, 37, 38, etc. are fed into ROM 39.

Outputs for ROM 39 for various N and $\Delta T$ signals are illustrated in the table of FIG. 9.

The output from ROM 39 provides the $\Delta f$ signal, illustrated in FIG. 1.

In this embodiment, a wavelength is measured by taking an average value as is described above. Accordingly, the true value of a wavelength can be found accurately even if the wavelength of a pattern varies depending upon the polarities of the pulses due to asymmetry. As a result, a variety of undesirable effects such as an unlocked state of the phase locked loop due to wave distortion which is, in turn, caused by such asymmetry can be well corrected.

It has been explained so far that the embodiment is used for solving problems due to asymmetry which is, in turn, caused by errors in length of pits engraved on a compact disc. It should be noted that the asymmetry also varies depending upon, among other things, the wavelength of the laser used for reading the pits.

In addition, the embodiment described above is equipped with averaging circuits for merely the 3T and 4T signals only because variations in wavelength for such small patterns give rise to large frequency deviations. It should be noted, however, that configurations of the embodiment are not limited to such a scheme. That is to say, additional averaging circuits for other signals can also be provided as necessary.

In this embodiment, the wavelength of each pattern in the EFM signal is measured by taking the average value of the lengths of each pattern as is described above. Accordingly, the true value of the pattern wavelength can be found accurately even if the wavelength varies depending upon the polarities of the pulses due to asymmetry. As a result, errors due to wave distortion which is, in turn, caused by the asymmetry inherent in a compact disc can be eliminated and an unlocked state of the phase locked loop can be avoided to enhance the reproduction performance of the compact disc.

What is claimed is:

1. A digital phase-locked loop circuit for removing errors in an eight-to-fourteen modulated signal produced in an optical disc system comprising:

a phase measuring means for measuring a phase difference between the eight-to-fourteen modulated signal and a clock signal wherein the phase difference is applied to a clock generator as a phase correction quantity and said clock generator generates said clock signal; and a frequency measuring means for measuring a frequency of the eight-to-fourteen modulated signal and applying a frequency deviation signal to the clock generator, wherein the frequency measuring means comprises a plurality of averaging circuits connected in parallel for computing an average value of the wavelengths of the eight-to-fourteen modulated signal, and further comprising a weighting circuit means connected to output signals of said plurality of averaging circuits for tabulating the frequency deviation.

* * * * *